(12) United States Patent
Iwata

(10) Patent No.: US 6,738,525 B1
(45) Date of Patent: May 18, 2004

(54) VARIABLE LENGTH DECODER AND VIDEO DECODING APPARATUS USING THE SAME

(75) Inventor: Haruya Iwata, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 652 days.

(21) Appl. No.: 09/650,817

(22) Filed: Aug. 30, 2000

(30) Foreign Application Priority Data

Aug. 31, 1999 (JP) .......... 11-246168

(51) Int. Cl.[7] .............. G06K 9/46
(52) U.S. Cl. .......... 382/246; 382/233; 341/65; 341/67
(58) Field of Search .......... 382/166, 232–239, 382/244–247, 253; 341/65, 67; 358/426.01–426.16; 708/203

(56) References Cited

U.S. PATENT DOCUMENTS

| | | | |
|---|---|---|---|
| 5,528,628 A | | 6/1996 | Park et al. |
| 5,600,812 A | * | 2/1997 | Park .......... 711/200 |
| 5,650,782 A | * | 7/1997 | Kim .......... 341/67 |
| 5,793,897 A | * | 8/1998 | Jo et al. .......... 382/246 |
| 5,831,557 A | * | 11/1998 | Handley .......... 341/67 |
| 6,198,848 B1 | * | 3/2001 | Honma et al. .......... 382/232 |

FOREIGN PATENT DOCUMENTS

| | | | |
|---|---|---|---|
| JP | 6-53840 | 2/1994 | |
| JP | 06053840 A | * 2/1994 | .......... H03M/7/42 |

* cited by examiner

*Primary Examiner*—Bhavesh M. Mehta
*Assistant Examiner*—Yubin Hung
(74) *Attorney, Agent, or Firm*—Oblon, Spivak, McClelland, Maier & Neustadt, P.C.

(57) ABSTRACT

The variable length code tables 10 are categorized into the first and second table groups, and a set of the entire bits of reference data consisting of variable length codes and part of bits of the table designation data for designating a table to which the reference data is referred, are inputted to the first table group, whereas a set of part of the bits of the reference data and the entire bits of the table designation data are inputted to the second table groups. Then, an output of either one of the first and second tables is selected by a selector of 2:1, and thus variable length decode data is obtained.

9 Claims, 4 Drawing Sheets

| VLC OF AC COMPONENT OF QUANTIZED DCT COEFFICIENT | INTRA ||
|---|---|---|
| | RUN | LEVEL |
| | | |
| | | |
| | | |
| ⋮ | ⋮ | ⋮ |
| | | |
| | | |

FIG. 3A

| VLC OF AC COMPONENT OF QUANTIZED DCT COEFFICIENT | INTER ||
|---|---|---|
| | RUN | LEVEL |
| | | |
| | | |
| | | |
| ⋮ | ⋮ | ⋮ |
| | | |
| | | |

FIG. 3B

| VLC OF DC COMPONENT OF QUANTIZED DCT COEFFICIENT | INTER ||
|---|---|---|
| | RUN | LEVEL |
| | | |
| | | |
| | | |
| ⋮ | ⋮ | ⋮ |
| | | |
| | | |

| VLC OF MBA | INCREMENT VALUE |
|---|---|
|  |  |
| ⋮ | ⋮ |
|  |  |

FIG. 5A

| VLC OF MB TYPE | MB QUANT | MB FORWARD PREDICTION | MB BACKWARD PREDICTION | MB PATTERN | MB INTRA |
|---|---|---|---|---|---|
|  |  |  |  |  |  |
|  |  |  |  |  |  |

I PICTURE

FIG. 5B

| VLC OF MB TYPE | MB QUANT | MB FORWARD PREDICTION | MB BACKWARD PREDICTION | MB PATTERN | MB INTRA |
|---|---|---|---|---|---|
|  |  |  |  |  |  |
|  |  |  |  |  |  |
|  |  |  |  |  |  |
|  |  |  |  |  |  |

P PICTURE

FIG. 5C

| VLC OF MB TYPE | MB QUANT | MB FORWARD PREDICTION | MB BACKWARD PREDICTION | MB PATTERN | MB INTRA |
|---|---|---|---|---|---|
|  |  |  |  |  |  |
|  |  |  |  |  |  |
|  |  |  |  |  |  |
| ⋮ | ⋮ | ⋮ | ⋮ | ⋮ | ⋮ |
|  |  |  |  |  |  |

B PICTURE

FIG. 5D

| VLC OF MB TYPE | MB QUANT | MB FORWARD PREDICTION | MB BACKWARD PREDICTION | MB PATTERN | MB INTRA |
|---|---|---|---|---|---|
|  |  |  |  |  |  |

D PICTURE

| VLC OF MB PATTERN | CBP |
|---|---|
| | |
| ⋮ | ⋮ |
| | |

FIG. 6

| VLC OF MV | CODE |
|---|---|
| | |
| ⋮ | ⋮ |
| | |

FIG. 7A

| VLC OF dMV | CODE |
|---|---|
| | |
| | |

FIG. 7B

| VLC | DC COMPONENT SIZE FOR LUMINANCE |
|---|---|
| | |
| ⋮ | ⋮ |
| | |

FIG. 8A

| VLC | DC COMPONENT SIZE FOR COLOR DIFFERENCE |
|---|---|
| | |
| ⋮ | ⋮ |
| | |

FIG. 8B

ID decoder and a video decoding apparatus using the variable length decoder.

VARIABLE LENGTH DECODER AND VIDEO DECODING APPARATUS USING THE SAME

CROSS-REFERENCE TO RELATED APPLICAITONS

This application is based upon and claims the benefit of priority from the prior Japanese Patent Application No.11-246168, filed on Aug. 31, 1999; the entire contents of which are incorporated herein by reference.

BACKGROUND OF THE INVENTION

The present invention relates to a variable length decoder for decoding a variable length code, and a video decoding apparatus such as an MPEG decoder using the variable length decoder.

The MPEG mode (Moving Picture Experts Group), which is an international standard of video compression, has been standardized, and video encoding apparatus (MPEG encoder) and video decoding apparatus (MPEG decoder), which operate on the MPEG mode are used widely in practice in storage systems or transmission systems of DVD systems.

In an MPEG decoder, a video signal is encoded by taking motion compensation adaptive prediction, discrete cosine transformation (DCT) and variable length coding in combination. A predictive mode has mainly an intra-frame predictive mode and an inter-frame predictive mode. A predictive error signal corresponding to the difference between a prediction signal (the prediction signal=0 in an intra-frame predictive mode) and an input video signal is converted into DCT coefficients by a discrete cosine transformer.

The DCT coefficients are quantized by a quantizer, and then they are variable-length-encoded by a variable length encoder. Further, header information items such as a motion vector, a predictive mode, a quantization step size and micro-block type, which are used in motion compensation adaptive prediction, are also encoded by the variable length encoder. The variable length codes from the variable length encoder are multiplexed and then outputted as a coded bit stream from the MPEG encoder.

The coded bit stream outputted from the MPEG encoder is inputted to the MPEG decoder via a storage medium and a transmission line. In the MPEG decoder, the variable length code which has been multiplexed into the inputted coded bit stream, is decoded by the variable length decoder, such as to generate a quantized DCT coefficient and header information. The quantized DCT coefficient is dequantized, and then inverse-DC-transformed by an inverse discrete cosine transformer to be transformed back to a predictive error signal. A predictive signal is generated from the predictive error signal, and an image signal is reconstructed from the predictive signal.

Here, it should be noted that in the variable length decoder, decoding is performed with use of a variable length code table in which quantized DCT coefficients and header information items are treated as information symbols and these information symbols and variable length codes are associated with each other.

In a conventional variable length decoder, a variable length code table unit includes the first table group including the (n+1)-number of tables and the second table group including the (m+1)-number of tables. Here, the entire bits (I bit) of reference data including variable length codes are commonly input to all tables of the variable length code table unit, and information symbols associated with the variable length codes inputted are outputted from the variable length code table unit. Then, an output (N bits) of one table is selected by a selector of (n+m+2):1, provided in a later stage than the tables, in accordance with table selection data, and thus variable length decode data is obtained.

With the above-described structure, if the number of tables (n+m+2) in the variable length code table is increased, the size of the selector MUX becomes larger in scale. Accordingly, the circuit scale of the entire variable length decoder becomes larger, which causes a decrease in its operation frequency.

In another example of the conventional variable length decoders, a variable length code table unit includes the first table group and the second table group. Here, reference data (I bits) and table designation data (J bits) are commonly input to all tables of the first and second table groups of the variable length code table unit, and information symbols associated with the inputted variable length codes are outputted as variable length decode data from one table designated by the table designation data.

In the case of this structure, unlike the before-described conventional example, there is no need to provide a large-scale selector in a later stage than the variable length code table unit; however if the number of tables of the variable length code table unit becomes large, the bit width J of the table designation data increases as well. As a result, the input bit width of the table is increased, and consequently the circuit scale is enlarged, thus decreasing the operation frequency.

As described above, in the conventional variable length decoders, a large-scale selector is required on an output side of the variable length code table or the input bit width of the variable length code table is increased. Consequently, they entail such a problem of increasing the entire circuit scale, which results in a decrease in the operation frequency.

BRIEF SUMMARY OF THE INVENTION

The object of the present invention is to provide a variable length decoder having a small circuit scale and capable of high-speed operation, and a video decoding apparatus which uses the variable length decoder.

According to the present invention, there is provided a variable length decoder including: a variable length code table unit configured to store a plurality of information symbols corresponding to a plurality of variable length codes, respectively, the variable length code table unit including at least a first table group of tables storing first variable length codes and a second table group of tables storing second variable length codes that are smaller than the first variable length codes in the number of codes and in code length, the tables of the second table group being larger in number than those of the first table group; and an input unit configured to input reference data and table designation data to the variable length code table unit with entire bits of the reference data and part of the bits of the table designation data being input to the first table group to output a first information symbol corresponding to the reference data from one table selected by the part of the bits of the table designation data, and part of the bits of the reference data and entire bits of the table designation data being input to the second table group to output a second information symbol corresponding to the part of bits of the reference data from one table selected by the entire bits of the table designation data.

As explained above, in the present invention, the bit width of the reference data to be inputted to each table group of the variable length code table unit is varied. With this structure, a large-scale selector is not required on an output side of the variable code table unit, or the input bit width of the variable length code table unit does not become excessively large. Therefore, it becomes possible to realize a variable length decoder capable of a high-speed operation in a small circuit scale.

Further, according to the preset invention, there is provided a video decoding apparatus which decodes a variable length code of a coded bit stream obtained by encoding a video signal, with use of the above-described variable length decoder.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3C are diagrams a diagram illustrating a variable length code table of quantized DCT coefficients contained in the first table group of a variable length code table unit in this embodiment;

FIG. 4 is a diagram illustrating a variable length code table of macro-block addresses contained in the second table group of a variable length code table unit in this embodiment;

FIGS. 5A to 5D are diagrams illustrating a variable length code table of macro-block types contained in the second table group of a variable length code table unit in this embodiment;

FIG. 6 is a diagram illustrating a variable length code table of macro-block patterns contained in the second table group of a variable length code table unit in this embodiment;

FIGS. 7A and 7B are diagrams illustrating a variable length code table of motion vectors contained in the second table group of a variable length code table unit in this embodiment; and FIGS. 8A and 8B are diagrams illustrating a variable length code table of DC component sizes for luminance and color difference, contained in the second table group of a variable length code table unit in this embodiment.

DETAILED DESCRIPTION OF THE INVENTION

An embodiment of the present invention will now be described in detail with reference to accompanying drawings.

Figure 1:
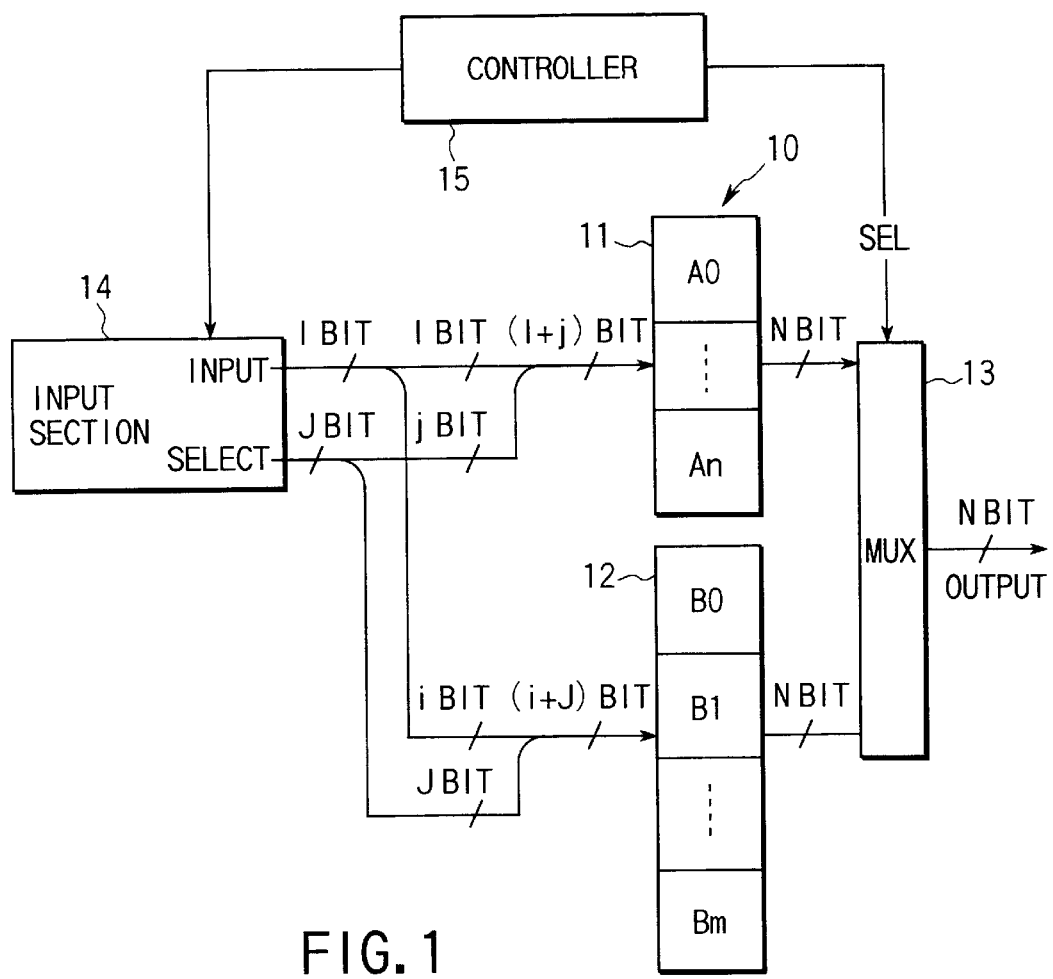
FIG. 1 is a block diagram showing the structure of a variable length decoder according to an embodiment of the present invention.

FIG. 1 shows the structure of a variable length decoder according to an embodiment of the present invention. The variable length decoder constructed by a variable length code table unit 10 including the first and second table groups 11 and 12, an input section 14 which inputs reference data and table designation data, which will be later explained, to the variable length code table unit 10, a two-input/one-output selector 13 which selects an output of either one of the first and second table groups 11 and 12, and a controller 15 which controls these members.

Specifically, the variable length code table unit 10 comprises a combination of logic circuits (random logic), and stores a plurality of information symbols associated with a plurality of variable length codes, respectively. It should be noted that the variable length code table unit 10 may be constructed by a ROM. Here, the first table group 11 and the second table group 12 have different distributions of the code word lengths of the variable length codes of information symbols stored therein. The first table group 11 has the (n+1)-number of tables A0 to An, and the second table group 12 has the (m+1)-number of tables B0 to Bm.

The tables A0 to An of the first table group 11 have a larger number of associated variable length codes than the tables B0 to Bm of the second table group 12, and the associated code word lengths are larger in the tables A0 to An of the first table group 11 than those of the tables B0 to Bm of the second table group 12. Further, the relationship in terms of the number of tables between the table groups 11 and 12 can be expressed as (n+1)<(m+1). In other words, as a table group which stores information symbols of a larger number of variable length codes and larger code word lengths, the table group becomes to have a less number of tables.

To the variable length code table unit 10, reference data Input of I bits, which is a bit stream of a variable length code and table designation data Select of J bits are input from an input section of the variable length decoder. During this operation, the leader end of the bit stream is accessed by the controller 15, and the reference data and table designation data are distributed as described below, and inputted as address data to the first and second table groups 11 and 12.

To the first table group 11, the entire bits (I bits) of the reference data Input and part of the bits (j bits) of the table designation data Select, that is, a total of (I+J) bits, are inputted. A symbol j is a value which is dependent on the number of tables, that is, (n+1), of the first table group 11, and there is a relationship of j<J. Meanwhile, to the second table group 12, part of bits (i bits) of the reference data Input and the entire bits (J bits) of the table designation data Select, that is, a total of (i+J) bits, are inputted.

Here, the number of inputted bits of the reference data Input, that is, i, which are inputted to the second table group 12, has a relationship of i<I. Therefore, with reference to the input bit width (I+j) of the first table group 11, the input bit width (i+J) of the second table group 12 is optimized to satisfy a relationship of (i+J)≦(I+j).

However, when the value i is made excessively small, the table reference capacity (performance) with respect to the second table group 12 is decreased. In order to avoid this, it is preferable that such a value i that equalize the table reference capacities with respect to the first and second table groups 11 and 12, should be selected. The table reference capacity is represented by the number of variable length codes which can output associated symbol data by inputting reference data to the table only one time. The significance of making the value i small is that even a variable length code having a relatively short code word length must be divided into a plurality of times to be inputted to the second table group 12. Consequently, the table reference capacity is lowered, and the processing speed is deteriorated as well.

Next, the operation of the variable length decoder of the embodiment will now be described.

When the reference data Input of I bits and the table designation data Select of J bits are input from the variable length code table unit 10 from the input section 14, the entire bits of the reference data Input and part of the bits of the table designation data Select, of j bit are inputted to the first table group 11. Thus, in the first table group 11, an information symbol associated with the I bits of the reference data Input (variable length code having a larger code word length) is outputted from one table selected by the j bits of the table designation data Select.

In the meantime, to the second table group 12, part of the bits of the reference data Input, that is, i bits, and the entire bits of the table designation data Select, that is, J bits are inputted. Thus, in the second table group 12, an information symbol associated with the i bits of the reference data Input (variable length code having a shorter code word length) is outputted from one table selected by the J bits of the table designation data Select.

To the selector 13, table group selection data Sel is inputted. Thus, one of the information symbol outputted from one table selected by the j bits of the table designation data Select of the first table group 11 and the information symbol outputted from one table designated by the J bits of the table designation data Select of the second table group 12 is selected by the selector 13 in accordance with the data contained in the bit stream, and the selected information symbol is outputted as variable length decode data Output in the final stage. In this manner, the decoding of a variable length code is conducted.

In the variable length decoder of the embodiment, the input bit width of the first table group 11 of the variable length code table unit 10 is (I+j) bit, and the input bit width of the second table group 12 is (i+J) bit. Since there are relationships of i<I and i<J, a relationship of (I+J)>(I+j)≧(i+J) can be obtained. Therefore, the structures of both of the first and second table groups 11 and 12 can be reduced.

Further, as the input bit width (i+J) of the second table group is made equal or less than the input bit width (I+j) of the first table group 11 by adjusting the value of i, the table reference capacity of the second table group 12 can be substantially equalized to that of the first table group 11.

In other words, the table reference capacity of the second table group 12 is determined by the value of i, and when this value is excessively small, the table reference capacity is deteriorated; however the symbol information stored in the second table group 12 is not originally constituted by variable length codes with larger code word lengths. Therefore, even if the value i is smaller than I, when the before-mentioned condition for the range, (i+J)≦(I+j), is satisfied, a table reference capacity equivalent to that of the first table group 11 which stores those symbol data which are constituted by more variable length codes with larger code lengths, can be obtained.

As described above, according to the present invention, it is possible to realize a variable length decoder capable of a high-speed operation by a small circuit scale.

Figure 2:
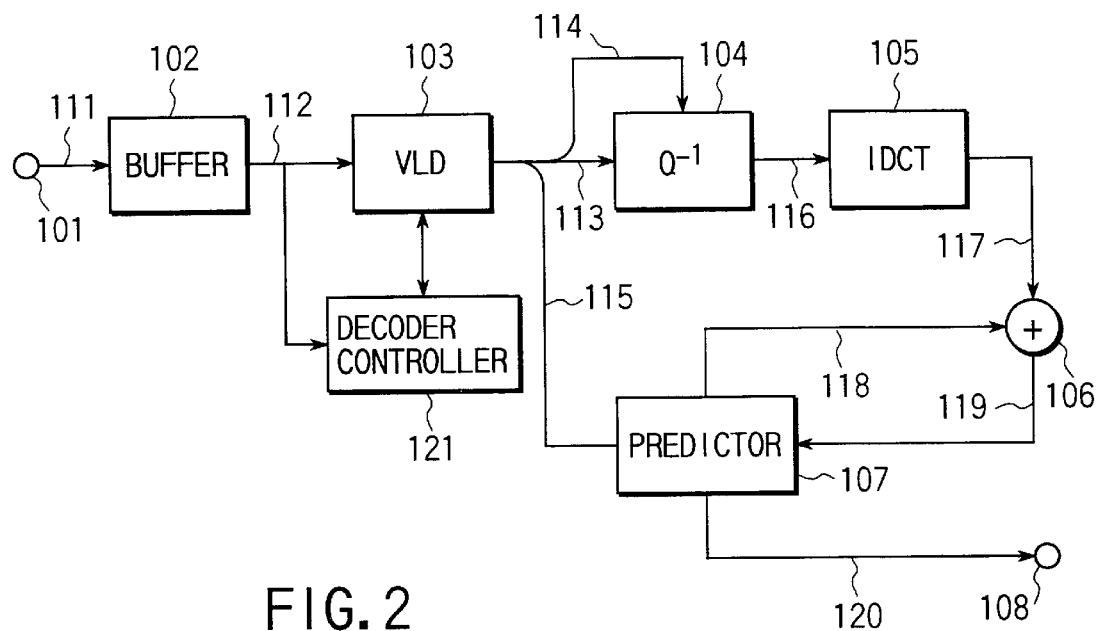
FIG. 2 is a block diagram showing the structure of an MPEG decoder, which is a video decoding apparatus which uses a variable length decoder of the present invention.

Next, a video decoding apparatus, which is a typical applied example of the variable length decoder of the present invention, will now be described. FIG. 2 is a block diagram showing a brief structure of an MPEG decoder, which is a typical example of the video decoding apparatus.

To an input terminal 101, an encoded bit stream 111 sent from a storage system or transmission system is inputted. The encoded bit stream 111 is a bit stream containing a variable length code obtained by encoding a video signal by an MPEG encoder, which is not shown in the figure, and the stream is temporarily stored in a buffer 102.

The encoded bit stream read from the buffer 102 becomes an input signal 112 to be inputted as reference data Input described in connection with FIG. 1 together with table designation data Select, to a variable length decoder 103 according to the present invention. Further, table group data sel, though it is not shown in FIG. 2, becomes an input 112 to the variable length decoder 103. The table designation data Select and the table group selection data sel are generated by a decoder controller 121, which is not shown, on the basis of data multiplexed in the encoded bit stream 112 and the MPEG specification.

The encoded bit stream is constructed mainly by variable length codes. The decoder controller 121 refers to the variable length code tables in the variable length decoder 103, and when there is a variable length code which coincides with a variable length code within the encoded bit stream, the code length of the variable length code is managed and the leading end of the encoded bit stream is accessed.

In this manner, the variable length code is decoded by the variable length decoder 103, and quantized orthogonal transformation coefficient data, i.e., quantized DCT coefficient data 113 variable-length-encoded by the MPEG encoder and header data are reproduced. Examples of the header information are quantized step size data 114 and predictive mode/motion vector/macro-block type data 115. It should be noted that, in an actual case, the output from the variable length decoder 103 is made of a combination of the quantized DCT coefficient data 113 or header data, and a code length.

The quantized DCT coefficient data 113 is inverse-quantized by an inverse quantizer 104 on the basis of the quantized step size data 114, and thus DCT coefficient data 116 is generated. The DCT coefficient data 116 is inverse-discrete-cosine-converted by an inverse discrete cosine converter 105, and thus a predictive error signal 117 is generated. The predictive error signal 117 is added by an adder 106, to a prediction signal 118 from a predictor 107, and thus a local decoded signal 119 is generated. The local decoded signal 119 is input to the predictor 107 to be used for a prediction in an next image.

The predictor 107 has an image memory capable of storing local decoded signals 119 for a plurality of pictures (for example, in the case of MPEG2, for 4 fields of pictures), and the predictor generates a predictive signal 118 with use of the predictive mode/motion vector/macro-block type data 115. A decoded video signal 120 is generated via the image memory in the predictor 107, and outputted from an output terminal 108.

The structure of the MPEG decoder is conventionally well-known, and therefore it will not be described in detail here, but a specific example of the variable length code table used in the variable length decoder 103 will now be described in detail. FIGS. 3 to 8 are diagrams illustrating a specific example of the variable length code table.

First, of the variable length code table unit 10 shown in FIG. 1, the first table group 11 includes variable length code tables for quantized DCT coefficients shown in FIGS. 3A, 3B and 3C. FIG. 3A shows a table exclusive for MPEG2, in which information symbols RUN (the number of zero runs up to non-zero coefficient) and LEVEL (the absolute value of coefficient) are associated with variable length codes VLC regarding the AC component (DCT coefficient from the second item on of the block) of a DCT coefficient of INTRA (intra-frame encoding). FIGS. 3B and 3C are tables common to MPEG1 and MPEG 2, information symbols RUN and LEVEL are associated with variable length codes VLC regarding the AC component (DCT coefficient of the first item of the block) of a DCT coefficient of INTER (inter-frame encoding).

In the meantime, of the variable length code table unit 10 shown in FIG. 1, the second table group 12 includes variable length code tables shown in FIGS. 4 to 8. FIG. 4 shows a table in which increment values of macro address blocks (MB) used to skip macro blocks which do not require information, as information symbols, are associated with the variable length codes VLC.

FIGS. 5A to 5D show variable length coding tables for macro block types (MB type). FIG. 5A indicates a P picture (inter-frame forward prediction coded image), FIG. 5B indicates a P picture (intra-frame forward prediction coded image), FIG. 5C indicates a B picture (inter-frame both directional prediction coded image), and FIG. 5D indicates a D picture (intra-frame coded image of only DC component). FIGS. 5A, 5B and 5C are common to MPEG1 and MPEG2, and FIG. 5D is exclusive for MPEG1. In FIGS. 5A to 5D, "MBQUANT" indicates whether or not the quantized step size of an associated macro block has been updated ("1" indicates that it has been updated), "MB forward prediction" indicates whether or not there is a forward prediction of an associated macro block, "MB backward prediction" indicates whether or not there is a backward prediction of an associated macro block, "MB INTRA" indicates whether or not there is an intra-frame coding an associated macro block, ("1" indicates that there is an intra-frame coding), and "MB pattern" indicates a block pattern of a macro block. These information symbols indicating macro block types are associated with variable length codes VLC. The "MB pattern" will be explained later.

FIG. 6 shows a variable length code table for macro block pattern (MB pattern). In this table, when the macro block type is an MC Coded (motion compensation predictive coded) type other than the intra-macro block, patterns (CBP: coded block pattern) each indicating whether or not each of 6 blocks (that is, 4 luminance blocks and 2 color difference blocks) contained in the macro block has a DCT coefficient, taken as information symbols, are associated with variable length codes VC.

FIGS. 7A and 7B show variable length code tables for motion vector (MV). FIG. 7A is a table in which codes each indicating a difference in motion vector between an MC Coded macro block and a macro block located next thereto on the left (that is, the one-previous block in timing), taken as information symbols, are associated with variable length codes VLC. FIG. 7B is a table in which codes each indicating a difference between motion vectors regarding two reference fields in dual prime prediction as one of the prediction modes, taken as information symbols, are associated with variable length codes VLC. It should be noted that the dual prime prediction is a prediction mode employed when the directions of the motion vectors of a coding subject field and two reference fields are close to each other, as known in connection with MPEG2, and the difference vector (dMV) of these two motion vectors is transmitted as a variable length code.

FIGS. 8A and 8B each show a variable length code table for the DC component size regarding the luminance and color difference, in which the sizes of the DC components of the DCT coefficients for the luminance and the sizes of the DC components of the DCT coefficients for the color difference, taken as information symbols, are associated with variable length codes VLC.

Here, the first table group 11 and the second table group 12 will now be compared with each other in terms of the number of tables, the number of variable length codes associated and the length of cord word.

First, as to the number of tables, the first table group 11 includes the variable length code tables for quantized DCT coefficients, presented in FIGS. 3A, 3B and 3C, and the number of tables (n+1) is 3. In contrast, the second table group 12 includes the variable length code tables for MBA, presented in FIG. 4, the variable length code tables for MB type, presented in FIGS. 5A, 5B, 5C and 5D, the variable length code tables for MB pattern, presented in FIG. 6, the variable length code tables for MV, presented in FIGS. 7A and 7B, and the variable length code tables for DC component size regarding luminance and color difference, presented in FIGS. 8A and 8B, the number of tables (m+1) is many as 10.

Next, as to the number of associated variable length codes, in the variable length code tables for quantized DCT coefficients, presented in FIGS. 3A, 3B and 3C, which belongs to the first table group 11, the number of codes is so many as 100 or more in any of the tables shown in FIGS. 3A, 3B and 3C. In contrast, regarding the second table group 12, in the variable length code tables for MBA, presented in FIG. 4, the number of codes is, for example, 35, in the variable length code tables for MB type, presented in FIGS. 5A, 5B, 5C and 5D, the number of codes in each of these tables, is 2, 4, 11 and 1, respectively, in the variable length code tables for MB pattern, presented in FIG. 6, the number of codes is 60, in the variable length code tables for MV, presented in FIGS. 7A and 7B, the number of codes in each of these tables is 30 and some, and 3, respectively, and in the variable length code tables for DC component size regarding luminance and color difference, presented in FIGS. 8A and 8B, the number of codes is 12 in each table. Thus, as compared to the number of codes in the variable length code table for quantized DCT coefficient, the number of codes involved in the second table group is remarkably small.

Further, as to the code word lengths of associated variable length codes, the variable length code tables for quantized DCT coefficients, which belongs to the first table group 11, contain a great number of codes with code word lengths of 10 some bits, with a maximum bit length of 17 bits including its code (polarity) bit. In contrast, regarding the second table group 12, any of the variable length code tables for MBA, the variable length code tables for MB type, the variable length code tables for MB pattern, and the variable length code tables for DC component size regarding luminance and color difference, contain code with 10-bit length or less in most of the cases, and even if the length exceeds 10 bits, it is about 11 bits at maximum, although the ratio of such codes is very low.

Further, in this example, the bit widths I and i of the reference data Input and the bit width J and j of the table designation data Select, described in connection with FIG. 1, are, for example, I=8, i=6, J=4 and j=2, and therefore the aforementioned condition:

(i+J)≦(I+j) is satisfied. As described above, the maximum code word length of the variable length codes for quantized DCT coefficients is 17; however if the code bit is handled separately, it will become 16 bits. Therefore, by setting I=8, the number of times of referring to the variable length code table may be 2 at maximum.

Further, as described above, the coded bit stream is occupied mostly by the variable length code for quantized DCT coefficient, which has a relatively large code word length, and therefore as the bit width I of reference data, which is inputted to the first table group 11, is increased, the table reference capacity is improved, and accordingly the entire decode processing capacity is enhanced. However, although the variable length codes for quantized DCT coefficients involves larger code word lengths, there are not a very great number of codes with the maximum code word length or a length close to the maximum in terms of probability. Therefore, if the value of I is excessively increased, the circuit scale is increased more than necessary, which is not desirable.

On the other hand, the ratio of the header information contained in the coded bit stream is low, and therefore even if the bit width i of reference data Input, inputted to the second table group 12 is small, the influence on the entire decode processing capacity is small.

In view of the above, it is preferable that the condition (i+J)≦(I+j) should be satisfied.

It should be noted that the above embodiment is described in connection with the case where the variable length code table is categorized into two table groups; however the present invention is effective as well in the case where it is categorized into three or more table groups. To summarize this, in the present invention, if a great number of tables are categorized into a plurality of table groups, a plurality of information symbols are stored therein as being associated with a plurality of variable length codes, and a table group which stores more information symbols associated with variable length codes with larger code word lengths includes less number of tables. Here, variable length code tables each for outputting an information symbol associated with an inputted variable length code are constituted, and to each table group of these variable length code tables, reference data including variable length codes, or a set of reference data and table designation data for designating a table to which the reference data is referred are inputted. When an information symbol associated with a variable length code obtained by decoding an inputted variable length code, is outputted, the bit widths of reference data to be inputted to each table group is made different from each other with reference to the input bit width of the table group which most associated with variable length codes with larger code word lengths, such that the input bit width of the other table groups becomes smaller than the reference input bit width.

As described, according to the present invention, variable coded tables are categorized into a plurality of table groups in such a manner that a table group which stores more information symbols associated with variable length codes with larger code word lengths becomes to consist of less number of tables. When reference data consisting of a variable length code is inputted to each table group of variable length code tables, the bit widths of reference data to be inputted to each table group is made different from each other with reference to the input bit width of the table group which most associated with variable length codes with larger code word lengths, such that the input bit width of the other table groups becomes smaller than the reference input bit width. In this way, it is possible to provide a variable length decoder capable of a high-speed operation with a small circuit scale, and a video decoding apparatus uses this decoder.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended claims and their equivalents.

What is claimed is:

1. A variable length decoder comprising:

first and second variable length code table groups which store a plurality of information symbols corresponding to a plurality of variable length codes;

an input section configured to input a set of entire bits of reference data including a variable length code, and part of bits of table designation data for designating a table to which the reference data is referred, to the first table group, and to a set of part of bits of the reference data and entire bits of the table designation data to the second table group; and a selection section configured to select an output from either one of the first and second table groups.

2. A variable length decoder according to claim 1, wherein the first table group stores a more number of variable length codes with larger code word lengths than those of the second table group, and the number of tables of the first table group is less than that of the second table group.

3. A variable length decoder according to claim 2, further comprising a setting section configured to set a bit width of reference data to be inputted to the second table group with reference to an input bit width of the first table group, such that the input bit width of the second table groups becomes equal to or smaller than the reference input bit width.

4. A video decoding apparatus comprising:

a buffer configured to store a bit stream containing a variable length code;

a variable length decoder according to claim 1, for decoding the variable length code of the coded bit stream;

an inverse quantizer configured to inverse-quantize decoded data of the variable length decoder and outputting orthogonal transformation coefficient data;

an inverse transformer for inverse-transforming the orthogonal transformation coefficient data and generating a predictive error signal; and a reconstruction section configured to generate a decoded video picture from the predictive error signal.

5. A variable length decoder comprising:

a variable length code table unit configured to store a plurality of information symbols corresponding to a plurality of variable length codes, respectively, the variable length code table unit including at least a first table group of tables storing first variable length codes and a second table group of tables storing second variable length codes that are smaller than the first variable length codes in the number of codes and in code length, the tables of the second table group being larger in number than those of the first table group; and an input unit configured to input reference data and table designation data to the variable length code table unit with entire bits of the reference data and part of the bits of the table designation data being input to the first table group to output a first information symbol corresponding to the reference data from one table selected by the part of the bits of the table designation data, and part of the bits of the reference data and entire bits of the table designation data being input to the second table group to output a second information symbol corresponding to the part of bits of the reference data from one table selected by the entire bits of the table designation data.

6. A video decoding apparatus comprising:

a buffer configured to store a bit stream containing variable length code;

a variable length decoder according to claim 5, for decoding the variable length code of the coded bit stream;

an inverse quantizer configured to inverse-quantize decoded data of the variable length decoder and outputting orthogonal transformation coefficient data;

an inverse transformer configured to inverse-transform the orthogonal transformation coefficient data and generate a predictive error signal; and an image reconstruction section configured to generate a decoded video image from the predictive error signal.

7. A video decoding apparatus according to claim 6, wherein the table groups of the variable length decoder include first and second table groups, a table of the first table group includes a greater number of variable length codes and codes with larger code word lengths than those of a table of the second table group, and the number of tables of the first table group is less than that of the second table group.

8. A video decoding apparatus according to claim 6, further comprising a selection section configured to select one of outputs from a plurality of these table groups of the variable length decoder.

9. A variable length decoder according to claim 5, which further comprises a selector to select one of the first information symbol and the second information symbol.

* * * * *